(12) United States Patent
Cao et al.

(10) Patent No.: US 10,460,803 B2
(45) Date of Patent: Oct. 29, 2019

(54) MEMORY CELL, MEMORY CELL ARRAY, MEMORY DEVICE AND OPERATION METHOD OF MEMORY CELL ARRAY

(71) Applicants: Semiconductor Manufacturing International (Shanghai) Corporation, Shanghai (CN); Semiconductor Manufacturing International (Beijing) Corporation, Beijing (CN)

(72) Inventors: Heng Cao, Shanghai (CN); Sheng Fen Chiu, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/057,316

(22) Filed: Aug. 7, 2018

(65) Prior Publication Data

US 2019/0066785 A1    Feb. 28, 2019

(30) Foreign Application Priority Data

Aug. 23, 2017  (CN) .......................... 2017 1 0726725

(51) Int. Cl.
*G11C 13/00*    (2006.01)
*H01L 27/24*    (2006.01)
(Continued)

(52) U.S. Cl.
CPC ...... *G11C 13/0097* (2013.01); *G11C 13/0004* (2013.01); *G11C 13/004* (2013.01);
(Continued)

(58) Field of Classification Search
CPC ............ G11C 13/0097; G11C 13/0004; G11C 13/0007; G11C 13/004; G11C 13/0069;
(Continued)

(56) References Cited

U.S. PATENT DOCUMENTS 8,351,240 B2 *   1/2013   Park ................... G11C 11/5678
                                                       365/113
8,638,590 B2 *   1/2014   Hao ........................ G11C 11/16
                                                       365/148

(Continued)

*Primary Examiner* — Tri M Hoang
(74) *Attorney, Agent, or Firm* — Anova Law Group, PLLC

(57) ABSTRACT

Semiconductor devices and fabrication methods thereof are provided to form a memory cell. The memory cell includes a first diode, a second diode separated from the first diode. The first diode includes a first well region in a substrate, a first N-type doped region adjacent to the first well region and connected to a bit line, and a first P-type doped region adjacent to the first well region and separated from the first N-type doped region. The second diode includes a second well region in the substrate, a second N-type doped region adjacent to the second well region, and a second P-type doped region. The memory cell further includes a bottom electrode connected to the first P-type doped region and the second N-type doped region, respectively, a top electrode connected to a word line, and a data storage material layer located between the bottom electrode and the top electrode.

16 Claims, 3 Drawing Sheets

(51) Int. Cl.
*H01L 29/861* (2006.01)
*H01L 45/00* (2006.01)
*H01L 29/06* (2006.01)

(52) U.S. Cl.
CPC ...... *G11C 13/0007* (2013.01); *G11C 13/0069* (2013.01); *H01L 27/2409* (2013.01); *H01L 27/2463* (2013.01); *H01L 29/861* (2013.01); *H01L 45/06* (2013.01); *H01L 45/08* (2013.01); *H01L 45/1233* (2013.01); *H01L 45/144* (2013.01); *H01L 45/146* (2013.01); *G11C 2013/005* (2013.01); *G11C 2013/009* (2013.01); *G11C 2213/32* (2013.01); *G11C 2213/52* (2013.01); *G11C 2213/72* (2013.01); *H01L 29/0649* (2013.01); *H01L 45/1253* (2013.01)

(58) Field of Classification Search
CPC ............. H01L 27/2409; H01L 27/2463; H01L 29/861; H01L 29/8613; H01L 45/06; H01L 45/08; H01L 45/1233; H01L 15/144; H01L 45/146
See application file for complete search history.

(56) References Cited

U.S. PATENT DOCUMENTS

| | | | |
|---|---|---|---|
| 2010/0315866 A1* | 12/2010 | Park | G11C 11/5678 365/163 |
| 2012/0075906 A1* | 3/2012 | Ho | G11C 11/16 365/148 |

* cited by examiner

MEMORY CELL, MEMORY CELL ARRAY, MEMORY DEVICE AND OPERATION METHOD OF MEMORY CELL ARRAY

CROSS-REFERENCES TO RELATED APPLICATION

This application claims the priority of Chinese Patent Application No. 201710726725.2, filed on Aug. 23, 2017, the content of which is incorporated by reference in its entirety.

TECHNICAL FIELD

The present disclosure generally relates to the field of memory technology, and more particularly, relates to a memory cell, a memory cell array, a memory cell device, and an operating method of the memory cell array.

BACKGROUND

For a resistive random access memory (RRAM) or a phase change random access memory (PCRAM), 1T1R (i.e., a transistor and a resistive memory/a phase change memory) array architecture is a common array architecture. Comparing to the array architecture of 1T1R, 2D1R (i.e., two diodes and one resistive random access memory) can have a higher working current, a lower leakage current, and a higher array density.

In the 2D/1R array architecture, the first diode of the two diodes includes a P+ doped region and an n-well. PN junction is formed at the interface between the P+ doped region and the n-well. The second diode of the two diodes includes an N+ doped region and a p-well. PN junction is formed at the interface between the N+ doped region and a p-well. In the 2D/1R array architecture, the n-well of the first diode is used as a bit line, and the p-well of the second diode is used a reset line.

Problems arise, however, the set current and the reset current of the 2D/1R array architecture described above are small.

Therefore, there is a need to provide array architecture of a 2D/1R in which the reset current and the reset current may be increased.

The disclosed devices and methods are directed to at least partially alleviate one or more problems set forth above and to solve other problems in the art.

SUMMARY

One aspect of the present disclosure provides a memory cell. The memory cell includes a first diode, a second diode separated from the first diode. The first diode includes a first well region in a substrate, a first N-type doped region adjacent to the first well region and connected to a bit line, and a first P-type doped region adjacent to the first well region and separated from the first N-type doped region. The second diode includes a second well region in the substrate, a second N-type doped region adjacent to the second well region, and a second P-type doped region. The second well region has a conductivity type same as the first well region and the second P-type doped region is adjacent to the second well region, connected to a reset line, and separated from the second N-type doped region. The memory cell further includes a bottom electrode connected to the first P-type doped region and the second N-type doped region, respectively, a top electrode connected to a word line, and a data storage material layer located between the bottom electrode and the top electrode.

Another aspect of the present disclosure provides a method for operating a memory cell. The method includes providing the memory cell and performing a setting operation on the memory cell at row i and column j. The memory cell includes a first diode, a second diode separated from the first diode. The first diode includes a first well region in a substrate, a first N-type doped region adjacent to the first well region and connected to a bit line, and a first P-type doped region adjacent to the first well region and separated from the first N-type doped region. The second diode includes a second well region in the substrate, a second N-type doped region adjacent to the second well region, and a second P-type doped region. The second well region has a conductivity type same as the first well region and the second P-type doped region is adjacent to the second well region, connected to a reset line, and separated from the second N-type doped region. The memory cell further includes a bottom electrode connected to the first P-type doped region and the second N-type doped region, respectively, a top electrode connected to a word line, and a data storage material layer located between the bottom electrode and the top electrode. Performing the setting operation on the memory cell at row i and column j includes applying a set voltage to the word line i and floating word lines other than the word line i, applying 0V to the bit line j, and floating bit lines other than the bit line j, and floating all reset lines.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. Unless specifically stated otherwise, the relative arrangement of the components and steps set forth in these embodiments, and the numerical expression and the numerical value, should not be construed as limiting the scope of the present disclosure.

In addition, for ease of description, the size of each part shown in the figure is not necessarily drawn to scale. For example, the thickness or width of certain layers may be exaggerated relative to each other.

The following description of embodiments is merely exemplary and it is not intended to limit the scope of the present disclosure.

The techniques, the methods, or the apparatus, which are well known to those of ordinary skill in the relevant art, may not be discussed in detail. But when applicable, these techniques, methods and apparatus should be considered part of the specification.

The inventor discovers that, for memory cell, if the n-well of the first diode is used as a bit line, and the p-well of the second diode is used as a reset line, the resistance of the setting line and the resistance of the reset line are too large and the set current and the reset current are too small.

Figure 1:
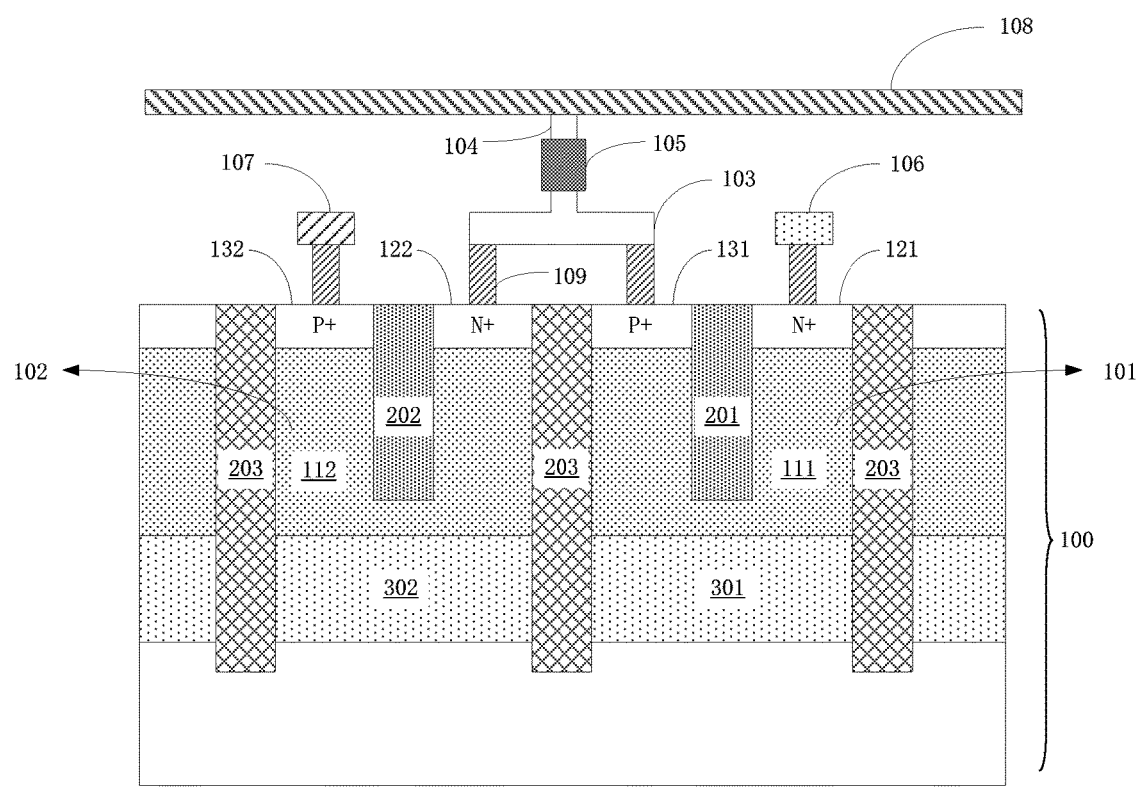
FIG. 1 is a schematic diagram of a memory cell according to one embodiment of the present disclosure.

FIG. 1 is a schematic diagram of a memory cell according to one embodiment of the present disclosure. As shown in FIG. 1, the memory cell may include a first diode 101, a second diode 102, a bottom electrode 103, a top electrode 104, and a data storage material layer 105. The second diode 102 may be separated from the first diode 101, and the data storage material layer 105 may be located between the bottom electrode 103 and the top electrode 104.

The first diode 101 may include a first well region 111 in the substrate 100, a first N-type doped region 121 (shown as N+) adjacent to the first well region 111, and a first P-type doped region 131 (shown as P+). The substrate 100 may be a semiconductor element substrate such as a silicon substrate, a germanium substrate, etc. The substrate 100 may also be a compound semiconductor substrate such as a gallium arsenide, etc. The first N-type doped region 121 may be connected to the bit line 106 (e.g. through a contact element 109). The first P-type doped region 131 may be separated from the first N-type doped region 121. In one embodiment of the present disclosure, the memory cell may further include a first isolation structure 201 and the first isolation structure 201 may extend into the first well region 111 from the surface of the substrate 200. Thus, the first P-type doped region 131 and the first N-type doped region 121 may be separated by the first isolation structure 201.

The second diode 102 may include a second well region 112 in the substrate 100, a second N-type doped region 122 (shown as N+) adjacent to the second well region 112, and a second P-type doped region 132 (shown as P+). The conductivity type of the second well region 112 may be the same as that of the first well region 111. For example, the conductivity type may be N-type or may be P-type. The second P-type doped region 132 may be connected to the reset line 107 (e.g. through a contact element 109), and the second P-type doped region 132 may be separated from the second N-type doped region 122. In an embodiment of the present disclosure, the memory cell may further include a second isolation structure 202, and the second isolation structure 202 may extend from the surface of the substrate 200 into the second well region 112. Thus, the second P-type doped region 132 and the second N-type doped region 122 may be separated by the second isolation structure 202.

The bottom electrode 103 may be connected to the first P-type doped region 131 and the second N-type doped region 122, respectively (e.g., through a contact element 109), and the top electrode 104 may be connected to the word line 108. The material of the bottom electrode 103 may be Pt/Ti, Au/Ti, TiN, Ru, or Cu. The top electrode 104 material may be Al, Pt, Ru, TiN, or TaN.

The data storage material layer 105 may include a phase change material layer or a variable resistance material layer. The phase change material layer may be converted between amorphous and crystal. The conversion between the high-resistance state and the low-resistance state may be enabled. The resistive material layer may be converted between a high resistance-state and a low-resistance state when different external voltages are applied. The phase change material layer may be a doped or an undoped chalcogenide, such as $Ge_2Sb_2Te_5$ or $Sb_2Te_3$. The variable resistance material layer may include one or more of $SiO_2$, NiO, CuxO, and $TiO_2$.

In the memory cell according to the present embodiment, a first N-type doped region of a first diode may be connected to a bit line, the second P-type doped region in the second diode may be connected to the reset line. The bit line and the reset line may be using a metal wire. Comparing to conventional memory cell in which the n-well of the first diode is used as a bit line, and the p-well of the second diode is used as a reset line, the resistance of the bit line and the reset line may be reduced, and the set current and the reset current may be increased as a result.

The memory cell may further include a third isolation structure 203. The third isolation structure 203 may extend from the surface of the substrate 100 into the substrate 100 under the first well region 111 and the second well region 121. The first diode 101 and the second diode 102 may be separated by the third isolation structure 203. The first isolation structure 201 and the second isolation structure 202 extend from the surface of the substrate 100 into the first well region 111 and the second well region 121. The third isolation structure 203 may extend from the surface of the substrate 100 to the substrate 100 under the first well region 111 and the second well region 121. In this regard, the first isolation structure 201 and the second isolation structure 202 may be shallow trench isolation (STI) structures, and the third isolation structure 203 may be a deep trench isolation structure (DTI).

To make better isolation between the first diode 101 and the second diode 102, the memory cell may include a field oxide region 301 in the first well region 111 and the memory cell may also include a field oxide region 302 in the second well region 112. The conductivity type of the field oxide region may be different from that of the first well region 111 and the second well region 112. In one embodiment of the present disclosure, the conductivity types of the first well region 111 and the second well region 112 may be N-type, e.g., as an n-well, and the conductivity type of the field oxide region may be P-type. In another embodiment of the present disclosure, the conductivity types of the first well region 111 and the second well region 112 may be P-type, e.g., as a p-well, and the conductivity type of the field oxide region may be N-type, e.g., as an n-well.

Various embodiments further provide a memory cell array. The memory cell array may include a number of the disclosed memory cells such as m×n memory cells, where m is the number of columns and n is the number of rows. For example, m×n is equal to or greater than 2, and both m and n are positive integers. In one embodiment, the area of each memory cell may be 16 $F^2$ (feature size F is about 45 nm).

Figure 2:
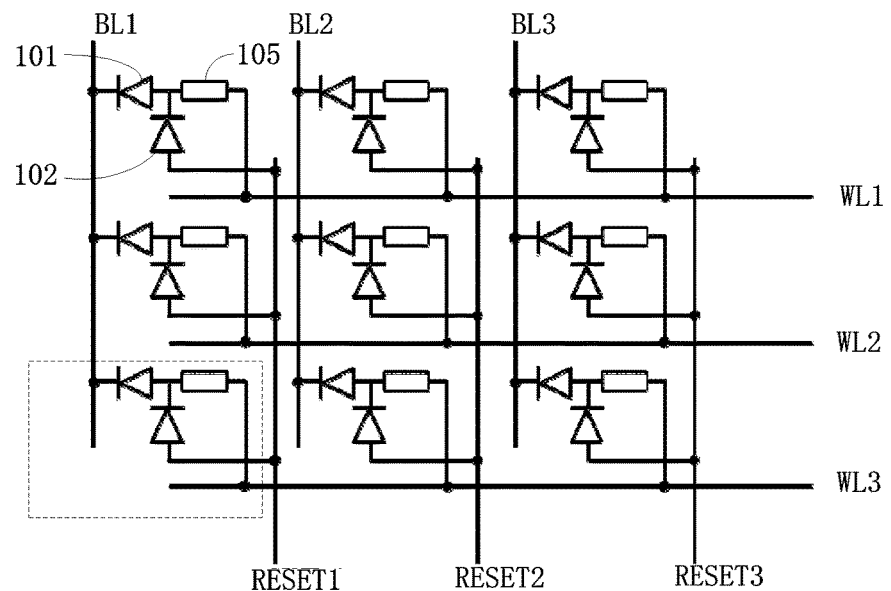
FIG. 2 is a schematic structural diagram of a memory cell array according to one embodiment of the present disclosure.
Figure 3:
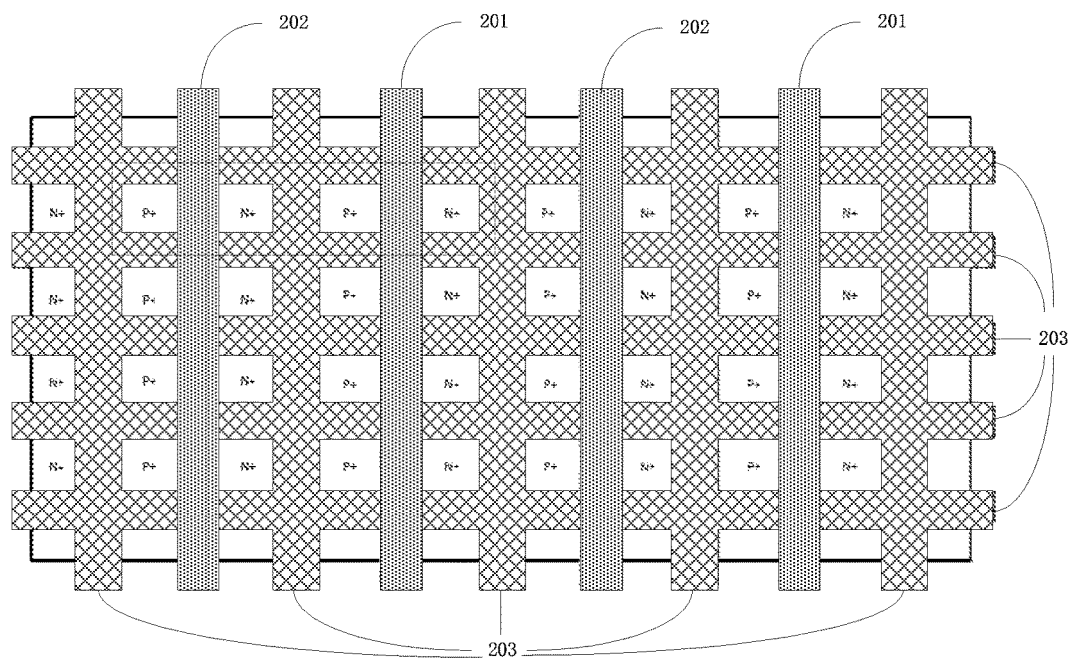
FIG. 3 is a layout diagram of a memory cell array according to one embodiment of the present disclosure.
Figure 4:
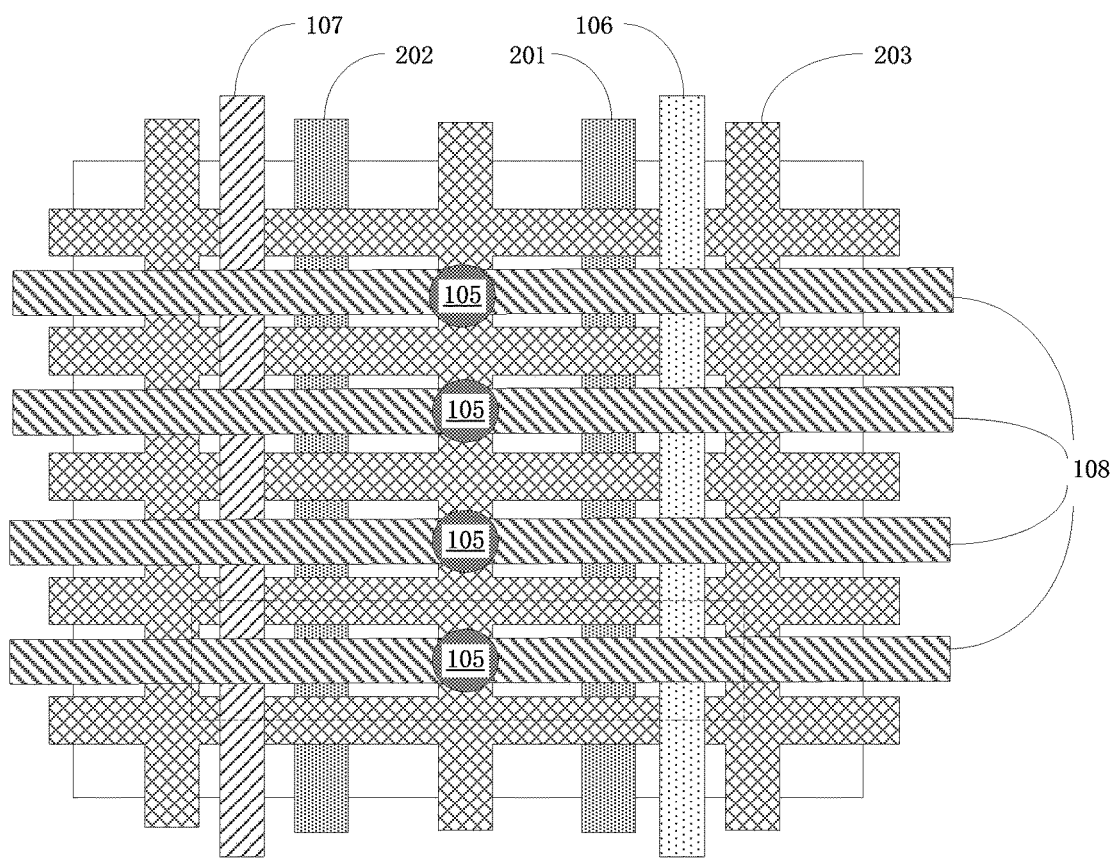
FIG. 4 is a layout diagram of a memory cell array according to another embodiment of the present disclosure.

FIG. 2 is a schematic structural diagram of the memory cell array according to one embodiment of the present disclosure. FIG. 3 is a layout diagram of a memory cell array according to one embodiment of the present disclosure. FIG. 4 is a layout diagram of a memory cell array according to another embodiment of the present disclosure. In FIG. 2, FIG. 3, and FIG. 4, the dotted lined areas show a memory cell. 3×3 memory cells are shown schematically in FIG. 2. 2×4 memory cells are schematically shown in the FIG. 3. 1×4 memory cells are schematically shown in FIG. 4.

The top electrode 104 in row i of the memory cell array may be connected to the word line i, where $1 \leq i \leq n$. For example, the top electrode 104 in first row of the memory cell array the may be connected to the first word line WL1. The top electrode 104 in the second row of the memory cell array may be connected to the second word line WL2. The top electrode in the third row of the memory cell array may be connected to the third word line WL3.

A first N-type doped region 121 of the first diode 101 in column j of the memory cell array may be connected to the bit line j, where 1≤j≤m. For example, the first N-type doped region 121 of the first diode 101 in the first column of the memory cell array may be connected to the first bit line BL1. The first N-type doped region 121 of the first diode 101 in the second column of the memory cell array may be connected to the second bit line BL2. The first N-type doped region 121 of the first diode 101 in the third column of the memory cell array may be connected to the third bit line BL3.

A second P-type doped region 132 of the second diode 102 in column j of the memory cell array may be connected to the reset line j, where 1≤j≤m. For example, the second N-type doped region 132 of the second diode 102 in the first column of the memory cell array may be connected to the first reset line RESET1. The second N-type doped region 132 of the second diode 102 in the second column of the memory cell array may be connected to the second reset line RESET2. The second N-type doped region 132 of the second diode 102 in the third column of the memory cell array may be connected to the third reset line RESET3.

The operation conditions of each of setting operation, reset operation, and read operation of a certain memory cell in the memory cell array are described below.

(1) The operation conditions for setting operation on the memory cell of row i and column j may include: a set voltage $V_{set}$, which is larger than 0V, may be applied to word line i and word lines other than word line i may be floating; 0V may be applied to bit line j, and bit lines other than bit line j may be floating; and all the reset lines may be floating.

(2) The operating conditions for resetting operation on the memory cell of row i and column j may include: 0V may be applied to word line i, and word lines other than word line i may be floating; all the bit lines may be floating; and a reset voltage $V_{reset}$, which is larger than 0V, may be applied to reset line j, and 0V may be applied to reset lines other than reset line j.

(3) The operating conditions for reading operation on the memory cell of row i and column j may include: a read voltage $V_{read}$, which is larger than 0V, may be applied to word line i and word lines other than word line i may be floating; 0V may be applied to bit line j, and bit lines other than bit line j may be floating; and all the reset lines may be floating.

Generally, $V_{SET}$ and $V_{RESET}$ are greater than $V_{read}$. In one embodiment of the present disclosure, $V_{SET}$ and $V_{RESET}$ may be in a range between 3V and 5V, and $V_{read}$ may be in a range between 1V and 1.5V.

The present disclosure further discloses an operating method of the memory cell array. The operating method may include one or more of the setting operation, the resetting operation and the reading operation on the memory cell of row i and column j.

The three exemplary operations are introduced below, respectively.

The setting operation on the memory cell of row i and column j may include: a set voltage $V_{set}$, which is larger than 0V, may be applied to word line i and word lines other than word line i may be floating; 0V may be applied to bit line j, and bit lines other than bit line j may be floating; and all the reset lines may be floating.

The resetting operation on the memory cell of row i and column j may include: 0V may be applied to word line i, and word lines other than word line i may be floating; all the bit lines may be floating; and a reset voltage $V_{reset}$, which is larger than 0V, may be applied to reset line j, and 0V may be applied to reset lines other than reset line j.

The reading operation on the memory cell of row i and column j may include: a read voltage $V_{read}$, which is larger than 0V, may be applied to word line i and word lines other than word line i may be floating; 0V may be applied to bit line j, and bit lines other than bit line j may be floating; and all the reset lines may be floating.

The present disclosure further provides a memory device, which includes the memory cell arrays disclosed herein. In one embodiment of the present disclosure, the memory device may include a resistive random access memory. In another embodiment of the present disclosure, the memory device may include a phase change memory.

In the memory cell provided by the embodiments of the disclosure, the first N-type doping region of the first diode is connected to the bit line, the second P-type doping region in the second diode is connected to the reset line, and the bit line and the reset line can be implemented by using a metal wire. Comparing with the prior art, in which the N-well of the first diode is used as a bit line and the P-well of the second diode is used as a reset line, the resistance of the bit line and the reset line is reduced, so that the set current and the reset current are increased.

The memory cell, the memory device, the memory cell array and the operating method thereof according to the embodiments of the present disclosure have been described in detail. To make the novel point of the present disclosure more clear, some details known in the art are not described, and those of ordinary skill in the relevant art may completely understand how to implement the technical scheme disclosed according to the above description. In addition, embodiments in the disclosure may be combined. The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A memory cell, comprising:
    a first diode, comprising:
        a first well region in a substrate;
        a first N-type doped region adjacent to the first well region and connected to a bit line; and
        a first P-type doped region adjacent to the first well region and separated from the first N-type doped region;
    a second diode separated from the first diode, and comprising:
        a second well region in the substrate, wherein the second well region has a conductivity type same as the first well region;
        a second N-type doped region adjacent to the second well region; and
        a second P-type doped region, adjacent to the second well region, connected to a reset line, and separated from the second N-type doped region;
    a bottom electrode connected to the first P-type doped region and the second N-type doped region, respectively;
    a top electrode connected to a word line; and
    a data storage material layer located between the bottom electrode and the top electrode.

2. The memory cell according to claim 1, wherein the data storage material layer comprises one of a phase change material layer and a variable resistance material layer.

3. The memory cell according to claim 1, further comprising:
a first isolation structure extending from a surface of the substrate into the first well region,
wherein the first P-type doped region and the first N-type doped region are separated by the first isolation structure.

4. The memory cell according to claim 1, further comprising:
a second isolation structure extending from a surface of the substrate into the second well region,
wherein the second P-type doped region and the second N-type doped region are separated by the second isolation structure.

5. The memory cell according to claim 1, further comprising:
a third isolation structure extending from a surface of the substrate and into the substrate under the first well region and the second well region,
wherein the first diode and the second diode are separated by the third isolation structure.

6. The memory cell according to claim 1, further comprising:
a field oxide region under the first well region and the second well region,
wherein the field oxide region has a conductivity type different from the conductivity type of the first well region and the conductivity type of the second well region.

7. The memory cell according to claim 6, wherein:
the conductivity type of the first well region and the conductivity type of the second well region are N-type, and
the conductivity type of the field oxide region is P-type.

8. The memory cell according to claim 6, wherein:
the conductivity type of the first well region and the conductivity type of the second well region are P-type, and
the conductivity type of the field oxide region is N-type.

9. A memory cell array comprising m×n memory cells including the memory cell according to claim 1, m and n being positive integers and m×n≥2, wherein:
the top electrode of the memory cell in row i of the memory cell array is connected to word line i, i being an integer and 1≤i≤n,
the first N-type doped region of the first diode of the memory cell in column j of the memory cell array is connected to bit line j, j being an integer and 1≤j≤m, and
the second P-type doped region of the second diode of the memory cell in column j of the memory cell array is connected to reset line j, 1≤j≤m.

10. The memory cell array according to claim 9, wherein operation conditions of setting operation on the memory cell at row i and column j comprise:
a set voltage is applied to the word line i and word lines other than the word line i are floating;
0V is applied to the bit line j, and bit lines other than the bit line j are floating; and
reset lines are all floating.

11. The memory cell array according to claim 9, wherein operation conditions of resetting operation on the memory cell at row i and column j include:
0V is applied to the word line i, and word lines other than the word line i are floating;
bit lines are all floating; and
a reset voltage is applied to the reset line j, and 0V is applied to reset lines other than the reset line j.

12. The memory cell array according to claim 9, wherein operation conditions of reading operation on the memory cell at row i and column j include:
a read voltage is applied to the word line i and word lines other than the word line i are floating;
0V is applied to the bit line j, and bit lines other than the bit line j are floating; and
reset lines are floating.

13. A memory device comprising the memory cell array according to claim 9.

14. A method for operating a memory cell, comprising:
providing the memory cell, the memory cell including:
a first diode, comprising:
a first well region in a substrate;
a first N-type doped region adjacent to the first well region and connected to a bit line; and
a first P-type doped region adjacent to the first well region and separated from the first N-type doped region;
a second diode separated from the first diode, and comprising:
a second well region in the substrate, wherein the second well region has a conductivity type same as the first well region;
a second N-type doped region adjacent to the second well region; and
a second P-type doped region, adjacent to the second well region, connected to a reset line, and separated from the second N-type doped region;
a bottom electrode connected to the first P-type doped region and the second N-type doped region, respectively;
a top electrode connected to a word line; and
a data storage material layer located between the bottom electrode and the top electrode; and
performing a setting operation on the memory cell at row i and column j, including:
applying a set voltage to word line i and floating word lines other than the word line i;
applying 0V to bit line j, and floating bit lines other than the bit line j; and
floating all reset lines.

15. The method according to claim 14, further including performing a resetting operation on the memory cell at row i and column j, including:
applying 0V to the word line i, and floating word lines other than the word line i;
floating all bit lines; and
applying a reset voltage to the reset line j, and applying 0V to reset lines other than the reset line j.

16. The method according to claim 14, further including performing a reading operation on the memory cell at row i and column j, including:
applying a read voltage to the word line i, and floating the word lines other than the word line i;
applying 0V to the bit line j, and floating the bit lines other than the bit line j; and
floating all the reset lines.

* * * * *